United States Patent [19]
Cognetti de Martiis et al.

[11] Patent Number: 5,237,485
[45] Date of Patent: Aug. 17, 1993

[54] APPARATUS AND METHOD FOR IMPROVED THERMAL COUPLING OF A SEMICONDUCTOR PACKAGE TO A COOLING PLATE AND INCREASED ELECTRICAL COUPLING OF PACKAGE LEADS ON MORE THAN ONE SIDE OF THE PACKAGE TO A CIRCUIT BOARD

[75] Inventors: Carlo Cognetti de Martiis, Milan; Bruno Murari, Monza, both of Italy

[73] Assignee: SGS Microelettronica S.p.A., Agrate, Italy

[21] Appl. No.: 602,926

[22] Filed: Oct. 22, 1990

Related U.S. Application Data

[63] Continuation of Ser. No. 855,840, Apr. 24, 1986, abandoned.

[30] Foreign Application Priority Data

Apr. 26, 1985 [IT] Italy ................................ 20503 A/85

[51] Int. Cl.⁵ ............................................. H05K 7/20
[52] U.S. Cl. ................................... 361/712; 174/52.4; 174/16.3; 361/761
[58] Field of Search ............................ 361/386–389, 361/401; 357/79–81; 174/16.3, 52.4, 52.2; 165/80.1, 80.2

[56] References Cited

U.S. PATENT DOCUMENTS

| | | | |
|---|---|---|---|
| 3,325,882 | 6/1967 | Chiou et al. ................... | 361/401 |
| 3,663,921 | 5/1972 | Richard ......................... | 174/52 FP |
| 4,270,138 | 5/1981 | Desmond ....................... | 174/16 HS |
| 4,481,525 | 11/1984 | Calabro et al. ............... | 174/16 HS X |
| 4,563,725 | 1/1986 | Kirby ............................ | 361/388 |

FOREIGN PATENT DOCUMENTS 20505485  3/1992  Italy .

Primary Examiner—Todd E. DeBoer
Attorney, Agent, or Firm—Antonio R. Durando; Harry M. Weiss

[57] ABSTRACT

A heat sink and method for heat sinking a package containing electronic components is described. The heat sinking is accomplished by use of a cooling plate located beneath a circuit board. The package having leads extending from more than one side of the package is positioned on the cooling plate so that the leads from the sides of the package can be electrically coupled to conductors on the circuit board wherein the circuit board is disposed about at least two and preferably three sides of the package. The package is secured to the cooling plate by a spring clip. The spring clip permits flexible positioning of the package relative to the cooling plate including positioning the package in close proximity of the edge of the cooling plate. Thermal conduction between the package and the cooling plate can be enhanced by the presence of a compressible thermally-conducting material. The circuit board preferably has an opening therein so as to permit the board to be in close proximity to the three sides of the package for increased connectibility.

3 Claims, 1 Drawing Sheet

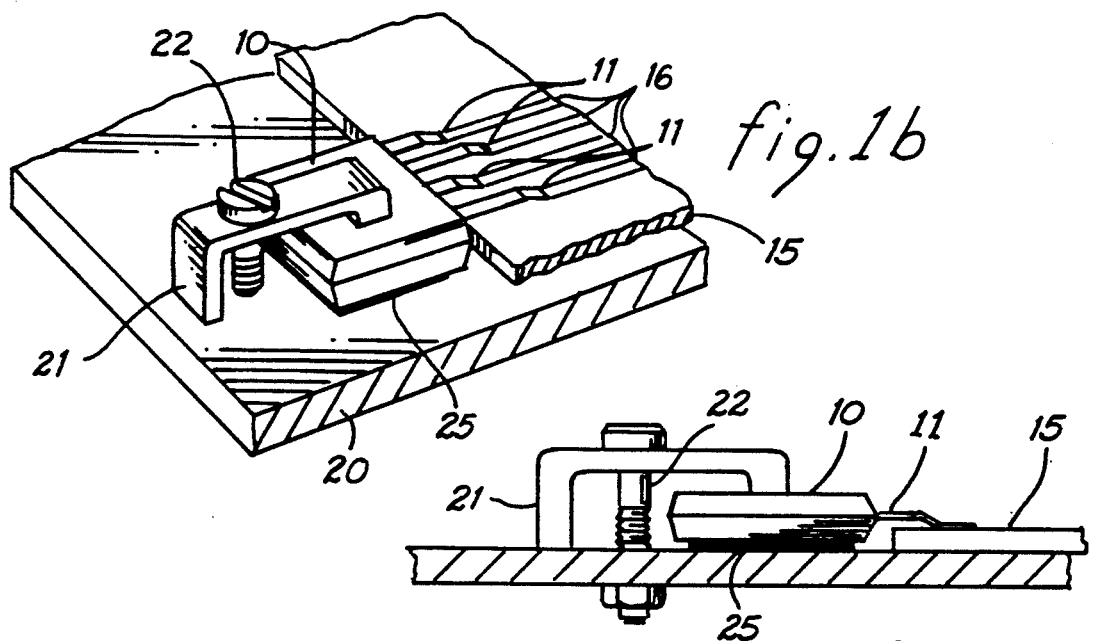
fig. 1b
fig. 1a
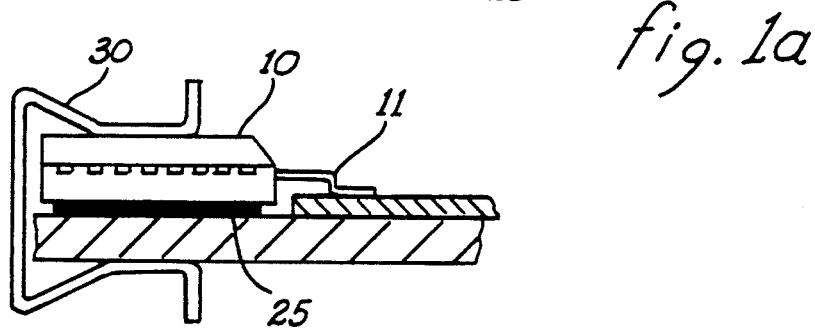
fig. 2a
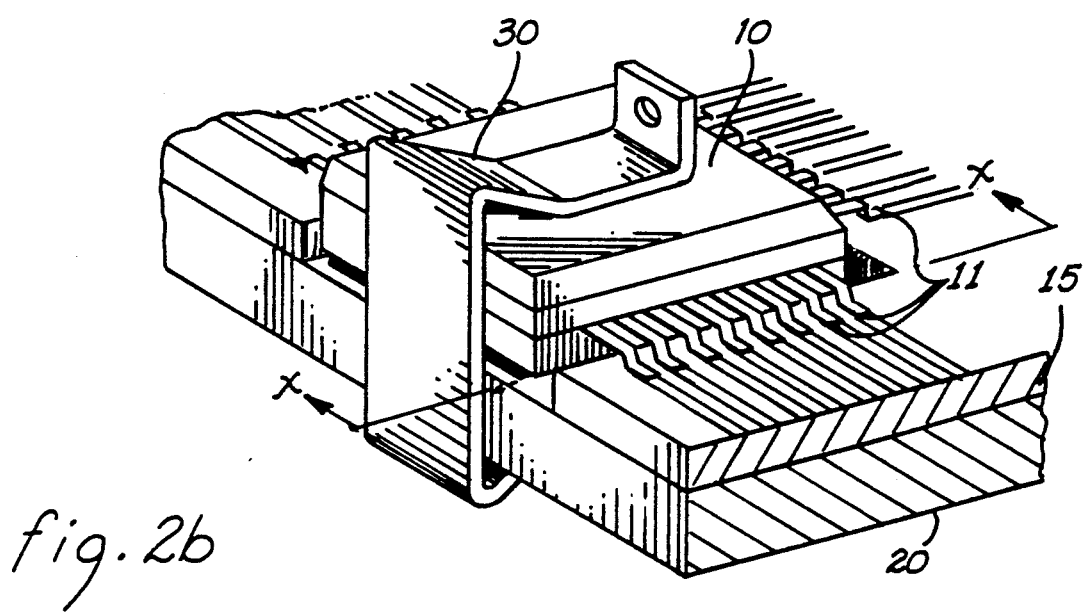
fig. 2b

APPARATUS AND METHOD FOR IMPROVED THERMAL COUPLING OF A SEMICONDUCTOR PACKAGE TO A COOLING PLATE AND INCREASED ELECTRICAL COUPLING OF PACKAGE LEADS ON MORE THAN ONE SIDE OF THE PACKAGE TO A CIRCUIT BOARD

This is a continuation of co-pending application Ser. No. 855,840 filed on Apr. 24, 1986, now abandoned.

RELATED APPLICATIONS

This application is based on parent Italian Application No. 20503 A/85, filed on Apr. 26, 1985, which is related to copending Italian Application No. 20505 A/85 filed on the same data by two common inventors. The present and the two Italian applications are owned by the same assignee.

1. Field of the Invention

This invention relates generally to cooling of semiconductor packages and, more particularly, to an improved apparatus and method for coupling such packages to an external cooling plate.

2. Discussion of the Related Art

It is known in the related art to couple a semiconductor package to a cooling plate by a mechanical structure that can force the package into intimate contact with the cooling plate. Typically, a screw type arrangement had been used for packages mounted on an apertured board because the package required close thermal contact with the cooling plate. Although the related art screw type arrangement provided some degree of mechanical adhesion, undesired lifting of the portion of the package that is furthest away from the screw area may occur; thereby increasing unwanted thermal resistance. As in an Italian Application Number 18,638, filed Mar. 8, 1979, a semiconductor heat sink screw type device is disclosed. Here, an integrated chip in a resinous block and a metallic strip projecting unilaterally from the block is fastened to the heat sink by a screw traversing through aligned holes in the projecting strip portion and an overlying clamp. The overlying clamp is bent into a casing around the projecting strip portion and a cantilevered tongue overlying the resinous block. The cantilevered tongue has a projection bearing upon the resinous block and applying pressure thereto.

In our copending application entitled "Apparatus AND METHOD FOR IMPROVED THERMAL COUPLING OF AN INTEGRATED CIRCUIT PACKAGE TO A COOLING PLATE" filed simultaneously herewith, force is directly applied to the electronic package rather than to a tongue projecting from the package. Such a screw type arrangement would significantly increase mechanical adhesion between the electronic package and cooling plate; thereby decreasing the chances of lifting the package which causes unwanted thermal dissipation resistance. The elevation of the screw head is higher than the height of either the clamp or package; thereby, providing a more direct or positive force exerted toward the clamp than the embodiment earlier described for the Italian Application Number 18,638. The positive clamping force applied directly to the electronic package, in addition to placing a flexible thermal material between the package and the cooling plate, increases heat dissipation which is a significant improvement from the related art. Although the above mentioned co-pending patent application results in providing a more significant mechanical adhesion than the previously described Italian Application Number 18,638, the leads from the package in the co-pending patent application, for coupling to the circuit extends from only one side of the package attached to the external heat sink. This embodiment limits the number of leads for coupling to the circuit board; thereby limiting the use of more elaborate circuits.

A need is therefore felt for an apparatus and method of thermally coupling packages of electronic components to a cooling plate that would permit relatively convenient insertion and removal of the package and would accommodate increased flexibility in positioning of the electronic package or component requiring cooling as well as permitting packages having a number of leads on more than one side thereof for coupling (by surface mounting) to a circuit board.

SUMMARY OF THE INVENTION

It is therefore an object of the present invention to provide an improved heat sink coupling mechanism for a semiconductor package.

It is a further object of the present invention to provide an improved method for coupling a semiconductor package to a cooling plate.

It is still another object of the present invention to provide a method and apparatus for coupling an electronic packaging component to a cooling plate while permitting the packaging having leads on more than one side thereof to be electrically coupled to a printed circuit board.

In accordance with the above and other objects there is provided heat sinking apparatus for dissipating heat in a semiconductor package wherein the package has conducting leads extending from a plurality of sides thereof including a cooling plate having first and second surfaces, a circuit board having an aperture formed therethrough and mounted on the first surface of the cooling plate and a spring clip means for securing the package to the first surface of the cooling plate within the aperture of the circuit board, the spring clip means contacting the top surface of the package and the second surface of the cooling plate.

BRIEF DESCRIPTION OF THE EMBODIMENTS OF THE INVENTION

In accordance with one embodiment of the present invention, apparatus for cooling a package containing leads on more than side thereof is described that includes a cooling plate; a printed circuit board located adjacent to the package; and spring clip means for securing the package to the cooling plate, while permitting the leads located on more than one side of the package to be in electrical contact with the printed circuit board, the spring clip means generally engaging a portion of the package opposite to a side of the package proximate the cooling plate, the spring clip means adapted to engage the cooling plate on a surface not in contact with the package.

In accordance with another embodiment of the present invention, the method of thermally coupling a component package having leads on more than one side thereof to a cooling plate is disclosed which includes securing the package to the cooling plate by a spring clip engaging a top surface of the package and a bottom surface of the cooling plate. The spring clip is adapted to permit the package to be secured to the cooling plate in the vicinity of an edge of the cooling plate while permitting the leads located on more than one side of the package to be in electrical contact with a printed circuit board.

In accordance with yet another embodiment of the present invention, an apparatus is described for cooling a package of electrical components having leads on more than one side thereof for connection to a printed circuit board. The apparatus includes heat sink means for dispensing heat applied thereto and coupling means for forcibly coupling the package to the heat sink means. The coupling means requires limited space for contact to the heat sink means while permitting the leads located on more than one side of the package to be in electrical contact with the printed circuit board.

According to yet another embodiment of the present invention, an electronic circuit configuration is disclosed. The configuration includes a circuit board, a cooling plate located on a first side of said circuit board, and at least one component package requiring thermal cooling and having leads on more than one side of the package. The component is positioned on the cooling plate to contact selected conductors on the circuit board. A coupling means is provided for securing the package to the cooling plate.

These and other features of the invention will be understood upon reading of the following description along with the drawings.

BRIEF DESCRIPTION OF THE DRAWINGS

FIG. 1a is an elevational view of an apparatus for heat sinking a semiconductor package in accordance with an embodiment in the above identified copending patent application;

FIG. 1b is a perspective view of the apparatus of FIG. 1a;

FIG. 2a is a cross-sectional view taken in the direction of arrows x—x, as shown in FIG. 2b, of an apparatus for heat sinking a semiconductor package having leads on more than one side of a package according to the instant invention; and FIG. 2b is a perspective view of the apparatus of FIG. 2a.

DESCRIPTION OF THE PREFERRED EMBODIMENT

Detailed Description of the Drawings

Referring to FIGS. 1a and 1b, an apparatus for efficient heat sinking a semiconductor package 10 is shown. Heat sink 20 serves as a platform for printed circuit board 15 which can be, for example, a portion of a hybrid substrate. The semiconductor package 10 has leads 11 extending therefrom. Leads 11 are electrically coupled to conducting paths 16 on printed circuit board 15. A nut and bolt mechanism 22 applies a force to lever or bridge unit 21 and semiconductor package 10. The force applied to the semiconductor package 10 permits a flexible thermal material 25 to provide a good thermal contact between semiconductor package 10 and heat sink 20 (i.e. via thermal material 25). This arrangement permits conducting leads for coupling to the circuit board project from only one side of the package.

Referring now to FIG. 2a and FIG. 2b, the apparatus of the present invention for thermally coupling the package 10 having leads on more than one side of the package to heat sink or cooling plate 20 is shown. The apparatus includes a spring clip 30 that contacts an upper surface portion of semiconductor package 10 and a bottom surface of the cooling plate 20. The circuit board 15, having an aperture formed therein, is adapted to be in close proximity about three sides of package 10. Thus, package 10 can have conducting leads 11 projecting from three sides thereof electrically coupled to circuit board 15. Again, a thermally-conducting material 25 can be disposed between semiconductor package 10 and cooling plate 20 to improve thermal conduction.

Operation of the Preferred Embodiment

As shown in FIG. 2a and FIG. 2b, the spring clip 30 replaces the nut and bolt apparatus of FIG. 1a and FIG. 1b in securing package 10 having leads on more than one side thereof to cooling plate 20. In this configuration, spring clip 30, in combination with the opening in the circuit board 15 where the package 10 is located, provides several distinct advantages. The position of semiconductor package 10 on the cooling plate 20 can be somewhat more flexible, and the package position is not limited by the position of the bolt holes that are otherwise required in the cooling plate of FIGS. 1a and 1b. This flexibility permits package 10 to be secured at different portions on the upper surface of cooling plate 20. In addition, spring clip 30 permits the package to be located closer to the edge of cooling plate 20. Spring clip 30 is easily and rapidly removed if cooling plate 20 must be moved relative to circuit board 15. If package 10 must be disconnected from circuit board 15, this removal is facilitated by the easy removal of spring clip 30. The ability to couple conducting leads from multiple sides of the semiconductor package (on three sides) as illustrated in FIG. 2b increases the circuit coupling flexibility between the package and the circuit board.

The above description is included to illustrate the operation of the preferred embodiment and is not meant to limit the scope of the invention. The scope of the invention is to be limited only by the following claims. From the foregoing discussion, many variations will be apparent to one skilled in the art that would yet be encompassed by the spirit and scope of the invention. For example, the nut and bolt arrangement of FIGS. 1a and 1b together with the package can be used in an opening in the circuit board 15 similar to the embodiment of FIGS. 2a and 2b.

What is claimed is:

1. Electronic apparatus for dissipating heat generated by a semiconductor electronic package electrically connected to a circuit board by means of conducting leads extending from a plurality of sides of the package, said apparatus comprising, in combination:

a semiconductor electronic package encapsulating an electronic device with an exposed, thermally-conductive, bottom surface and having electrically-conductive leads extending from a plurality of sides;

a cooling plate having a top and a bottom planar surface;

an electronic circuit board mounted on said top planar surface of the cooling plate and having at least one aperture along the edge of the cooling plate for permitting the attachment of said package to the top planar surface of the cooling plate, so that said exposed thermally-conductive bottom surface of the device is in contact with said top planar surface of the cooling plate and said electrically-conductive leads are in electrical connection with corresponding leads around said aperture in said circuit board;

a single-piece spring clip for securing said package to said cooling plate while permitting the leads located on said plurality of sides of the package to make electrical connection with the corresponding leads around the aperture in said circuit board, said spring clip having a top and a bottom lip, wherein the top lip engages a surface of said package opposite to the exposed thermally-conductive bottom surface of the device in contact with said top planar surface of the cooling plate, and wherein the bottom lip engages said bottom planar surface of the cooling plate.

2. The apparatus of claim 1, wherein a thermally conductive material is disposed between said exposed thermally-conductive bottom surface of the device encapsulated in the package and said top planar surface of the cooling plate.

3. The apparatus of claim 1, wherein said conducting leads extending from a plurality of sides of the package consist of centipede-type leads.

* * * * *